(12) United States Patent
Chou

(10) Patent No.: US 7,447,024 B1
(45) Date of Patent: Nov. 4, 2008

(54) HEAT SINK FOR A MEMORY

(76) Inventor: Kuan-Yin Chou, No. 33, Shuyi Rd., South District, Taichung City 40241 (TW)

( * ) Notice: Subject to any disclaimer, the term of this patent is extended or adjusted under 35 U.S.C. 154(b) by 0 days.

(21) Appl. No.: 11/778,700

(22) Filed: Jul. 17, 2007

(51) Int. Cl.
*H05K 7/20* (2006.01)
*F28F 7/00* (2006.01)

(52) U.S. Cl. .............. 361/695; 165/80.3; 165/185; 165/122; 361/719

(58) Field of Classification Search ......... 361/694–695
See application file for complete search history.

(56) References Cited

U.S. PATENT DOCUMENTS

| | | | | |
|---|---|---|---|---|
| 5,936,836 A | * | 8/1999 | Scholder | 361/695 |
| 6,671,177 B1 | * | 12/2003 | Han | 361/719 |
| 6,724,617 B2 | * | 4/2004 | Amaike et al. | 361/683 |
| 2002/0172008 A1 | * | 11/2002 | Michael | 361/697 |
| 2007/0285895 A1 | * | 12/2007 | Gruendler et al. | 361/711 |
| 2008/0123294 A1 | * | 5/2008 | Tsai | 361/695 |

* cited by examiner

*Primary Examiner*—Gregory D Thompson
(74) *Attorney, Agent, or Firm*—Banger Shia

(57) ABSTRACT

A heat sink for a memory comprises two heat-conducting sheets and a fan. Both sides of the memory are clamped by the two heat-conducting sheets, and between the two heat-conducting sheets is defined a convective space. The upper end of the convective space is sealed. The fan is disposed between the two heat-conducting sheets, so that the fan can guide the air into the convective space from exterior to exchange heat with the memory and the two heat-conducting sheets, and then the air will carry away the heat into the environment, so as to achieve the heat dissipating effect.

9 Claims, 8 Drawing Sheets

HEAT SINK FOR A MEMORY

BACKGROUND OF THE INVENTION

1. Field of the Invention

The present invention relates to a cooling accessory for an electronic component, and more particularly to a heat sink for a memory which can partially seal the internal convective space, so as to control the direction in which the heat is conducted out by the air.

2. Description of the Prior Art

During the recent electronic times, various electronic products have been rapidly developed on the market. In the design of the electronic product, the heat dissipation is the most important, because no matter how excellent the function of a product is, if the device is often burned due to bad heat-dissipating effect, the product will become unuseful. Thereby, various heat sinks have been continuously being developed one after another.

As known from the computer memory, the conventional heat sink is only disposed with two copper sheets at both sides thereof. Due to the fine heat conductivity of the copper, the heat of the memory can be quickly conducted into the air by the two copper sheets. However, the heat dissipating effect reached by the heat exchange between mediums is not fine. The air is the medium with poor heat conductivity, so the heat-dissipating effect of the heat conduction is quite unsatisfied.

Referring to FIGS. 1-2, a heat sink for a memory module disclosed in Taiwan Pat. No. 095219174 comprises two heat-conducting sheets 10 and a fan 20. The two heat conducting sheets 10 is positioned against both sides of a memory A opposite each other, and each heat conducting sheet 10 is formed with an air passage 11. Each air passage 11 includes an entry 111 and an exit 112. The fan 20 is disposed at one end of the two heat conducting sheets 10 and located at the entries 111 of the two air passages 11. The air is blew into the respective air passages 11 by the fan 20, so that the air flows through the respective air passages 11 to discharge the heat of the memory A through convection.

However, the heat-dissipating effect of this heat sink is not fine. Because the fan 20 is disposed at one end of the two heat-conducting sheets 10, and the air is sent from one end of each heat-conducting sheet 10 into the entry 111 of the air passage 11 of each heat-conducting sheet 10, and then the air will be expelled out from the exit 112 of each air passage 11. Hence, the part of the memory A located correspondingly to the entry 111 contacts the lower temperature air, so its heat is easily discharged by the air convection. The part of the memory A located correspondingly to the exit 112 contacts the air which has already absorbed the heat discharged at the entry 111, so the temperature of the air is comparatively higher. Thereby, it is difficult to discharge the heat through convection, thus causing an undesirable heat-dissipating effect of the part of the memory A located correspondingly to the exit 112, different heat-dissipating effects at both ends of the heat-conducting sheets 10 and a higher damage possibility.

The present invention has arisen to mitigate and/or obviate the afore-described disadvantages.

SUMMARY OF THE INVENTION

The primary objective of the present invention is to provide a heat sink for a memory, so as to uniformly and quickly dissipate the heat of the memory.

In order to achieve the abovementioned objective, the heat sink comprises two heat-conducting sheets and at least one fan. Both sides of the memory are clamped by the two heat-conducting sheets, and between the two heat-conducting sheets is defined a convective space. The upper end of the convective space is sealed, and the fan is disposed between the two heat-conducting sheets. The fan can suck the air into the convective space, and then the air will be expelled out through both ends of the convective space. By such arrangements, when the air enters into the convective space, the heat of the memory will be dissipated by the convection, and the hot air will be expelled out though both ends of the convective space, so the heat can be quickly and uniformly dissipated.

DETAILED DESCRIPTION OF THE PREFERRED EMBODIMENTS

The present invention will be clearer from the following description when viewed together with the accompanying drawings, which show, for purpose of illustrations only, the preferred embodiment in accordance with the present invention.

Figure 1:
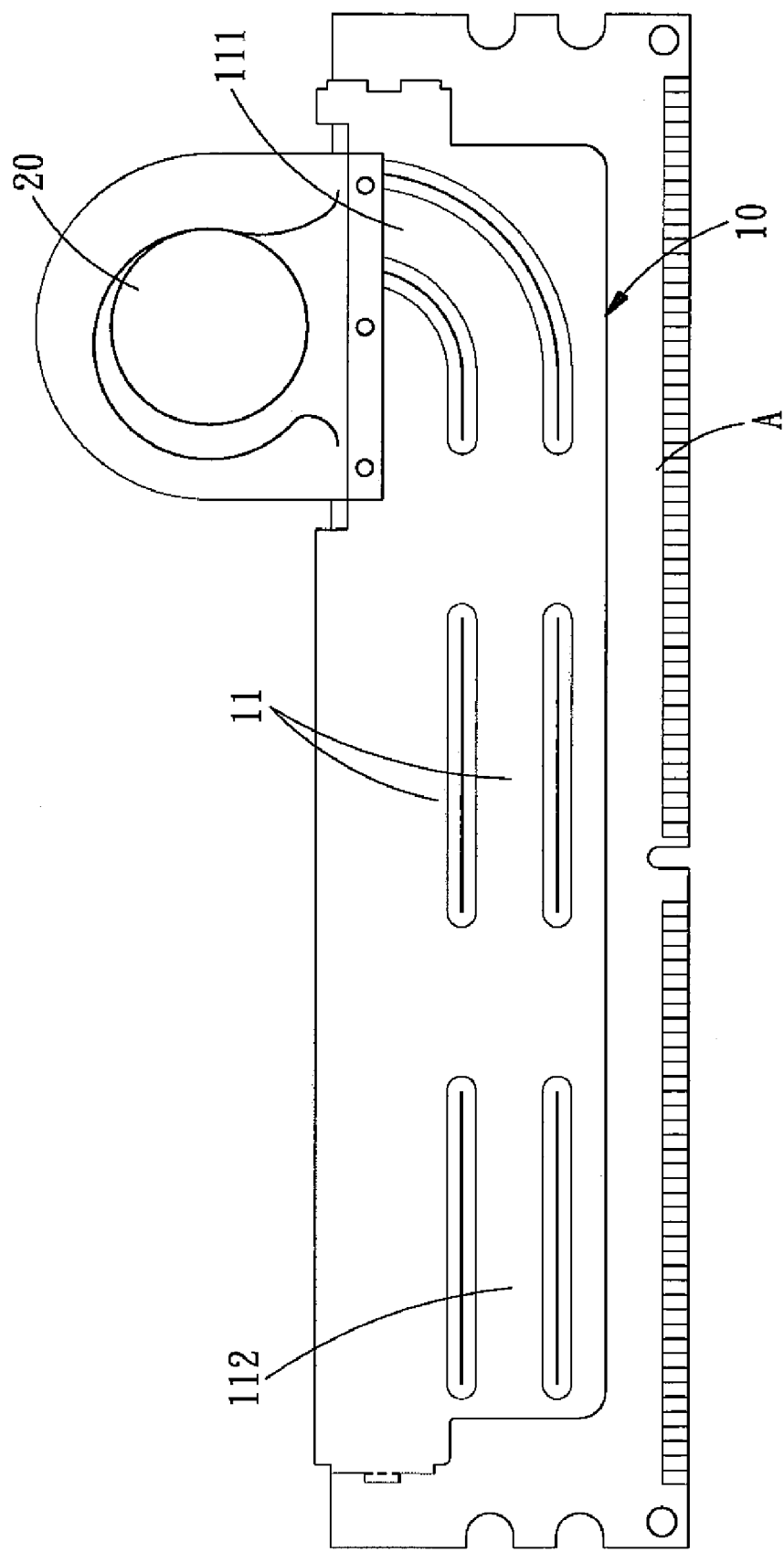
FIG. 1 shows a conventional heat sink.
Figure 2:
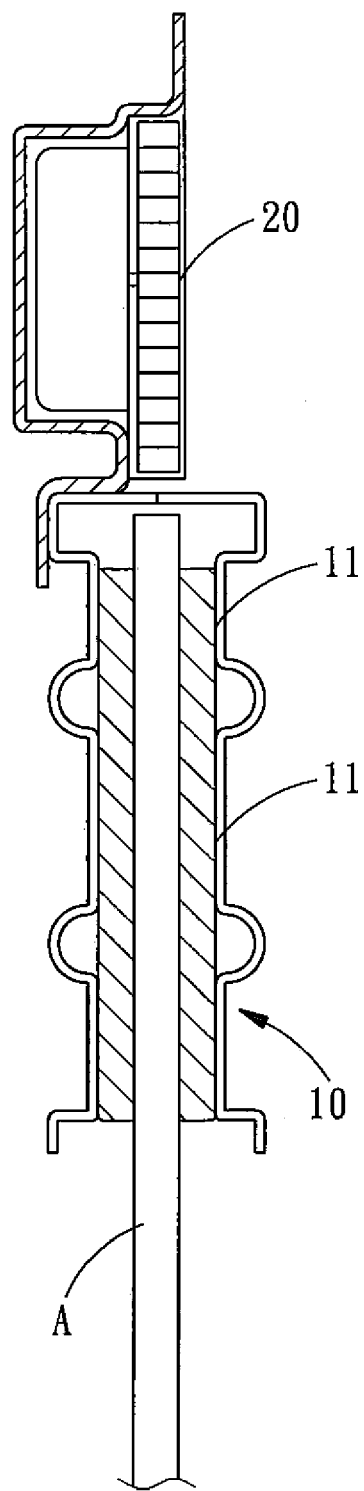
FIG. 2 shows the conventional heat sink in another angle.
Figure 3:
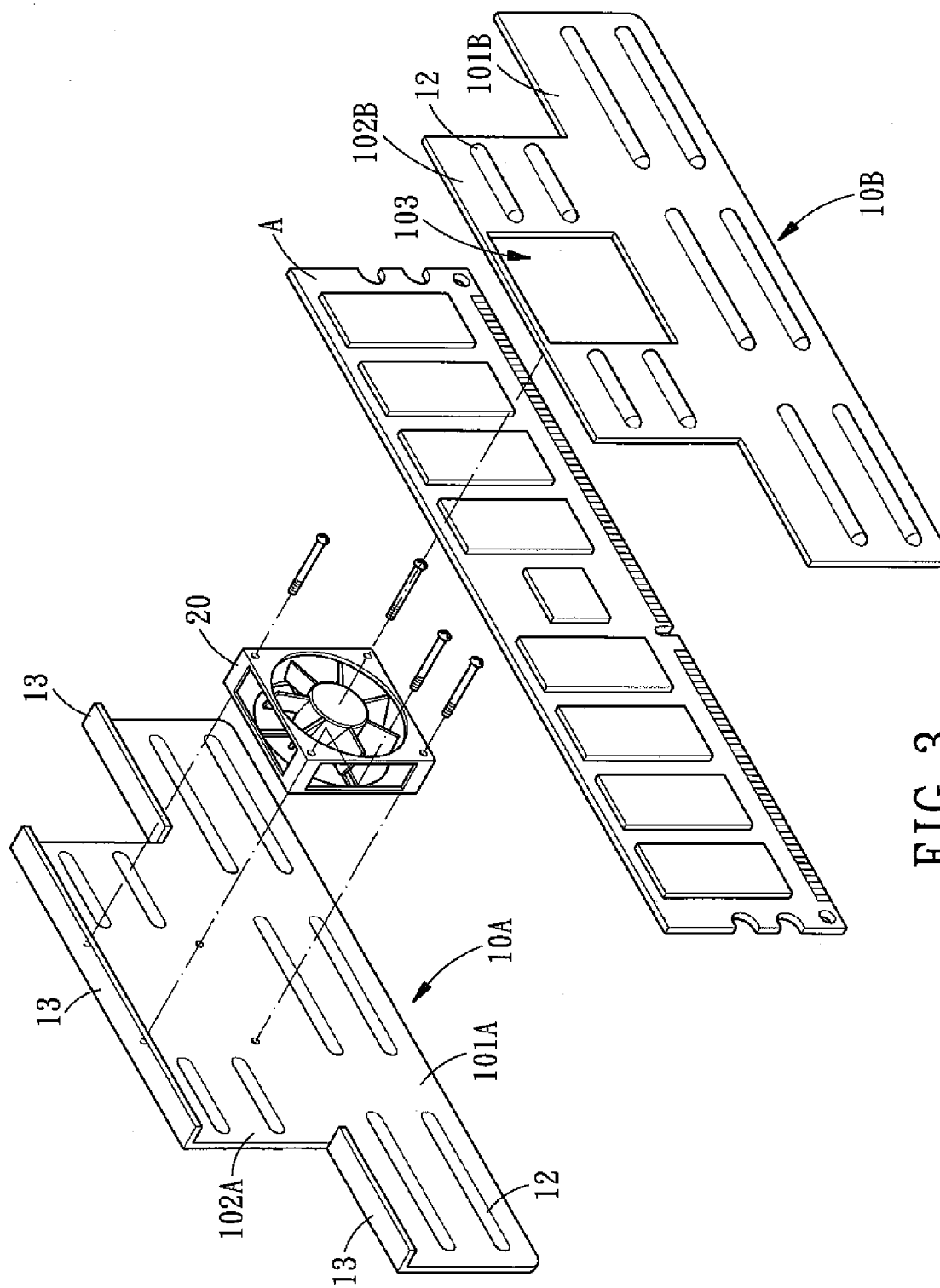
FIG. 3 is an exploded view of a heat sink for a memory in accordance with the present invention.
Figure 4:
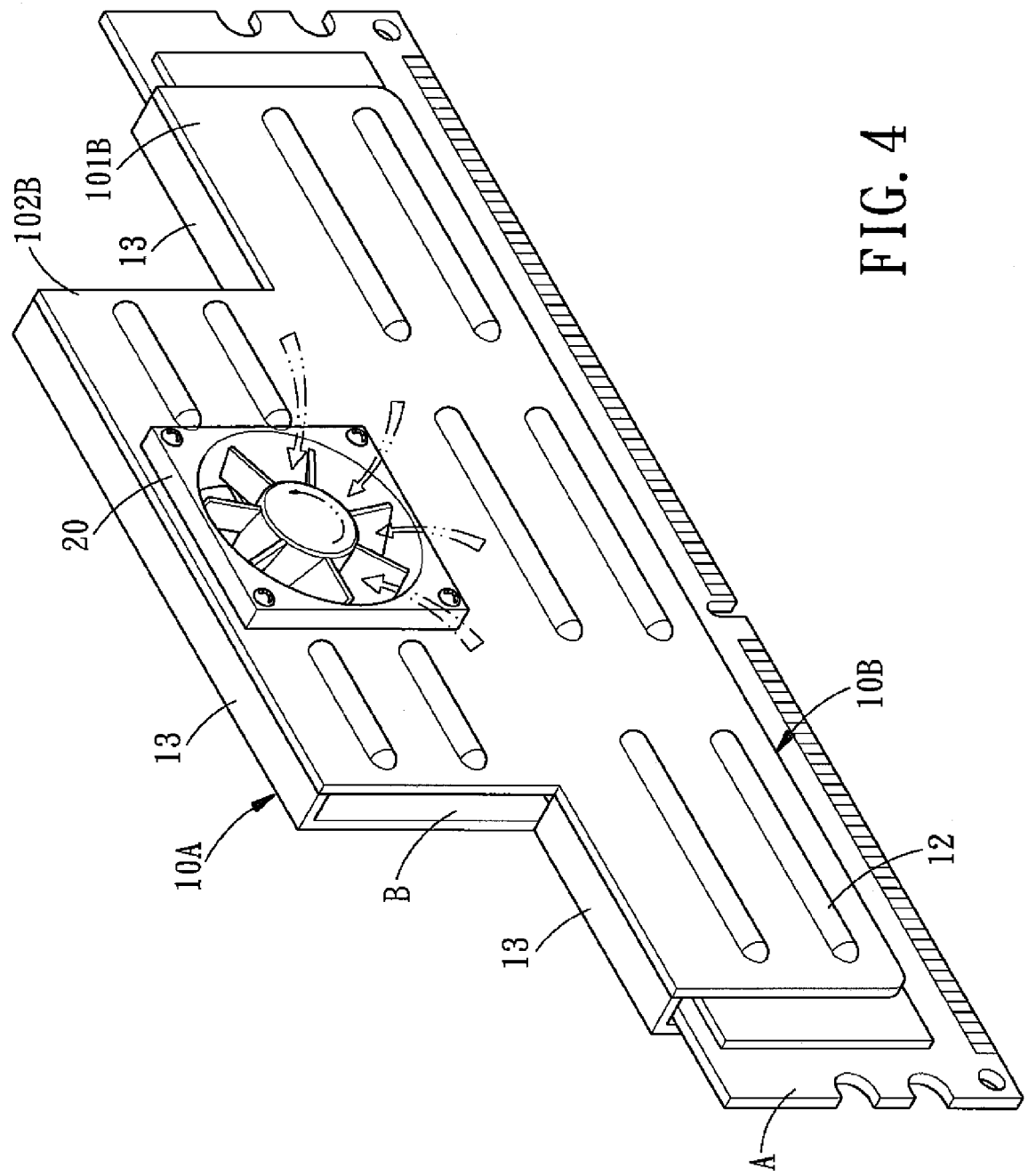
FIG. 4 is a perspective view of the heat sink for a memory in accordance with the present invention.

Referring to FIGS. 3-4, a heat sink for a memory in accordance with a preferred embodiment of the present invention comprises two heat-conducting sheets 10A, 10B and a fan 20.

The two heat-conducting sheets 10A, 10B are disposed at both sides of the memory A to clamp the memory A. Each of the two heat-conducting sheets 10A, 10B includes a base 101A, 101B and a heat-dissipating portion 102A, 102B. The upper end of each base 101A, 101B is connected with the lower end of each heat-dissipating portion 102A, 102B. The two heat-conducting sheets 10A, 10B utilizes their bases 101A, 102A to clamp the memory A to restrict the memory A under the heat-dissipating portions 102A, 102B of the two heat-conducting sheets 10A, 10B, and the heat-dissipating portions 102A, 102B of the two heat-conducting sheets 10A, 10B are used to define a convective space B. The bases 101A, 101B and the heat-dissipating portions 102A, 102B are disposed with a plurality of transverse ribs 12 respectively to improve the structural strength of the two heat-conducting sheets 10A, 10B. The upper end of the heat-dissipating portion 102A of the heat-conducting sheet 10A is formed with a cover plate 13 extended toward the other heat-conducting sheet 10B, and from the upper end of the base 101A located at both sides of the heat-dissipating portion 102A is extended two cover plates 13 toward the other heat-conducting sheet 10B. The three cover plates 13 of the heat-conducting sheet 10A are connected with the heat-conducting sheet 10B to seal the upper end of the convective space B. The heat-dissipating portion 102B of the heat-conducting sheet 10B is formed with a through hole 103 at the center thereof.

The fan 20 is inserted through the through hole 103 of the heat-conducting sheet 10B to be disposed on the heat-dissipating portion 102A of the heat-conducting sheet 10B, so as to retain the fan 20 in the convective space B. Moreover, all sides of the fan 20 are opened.

Figure 5:
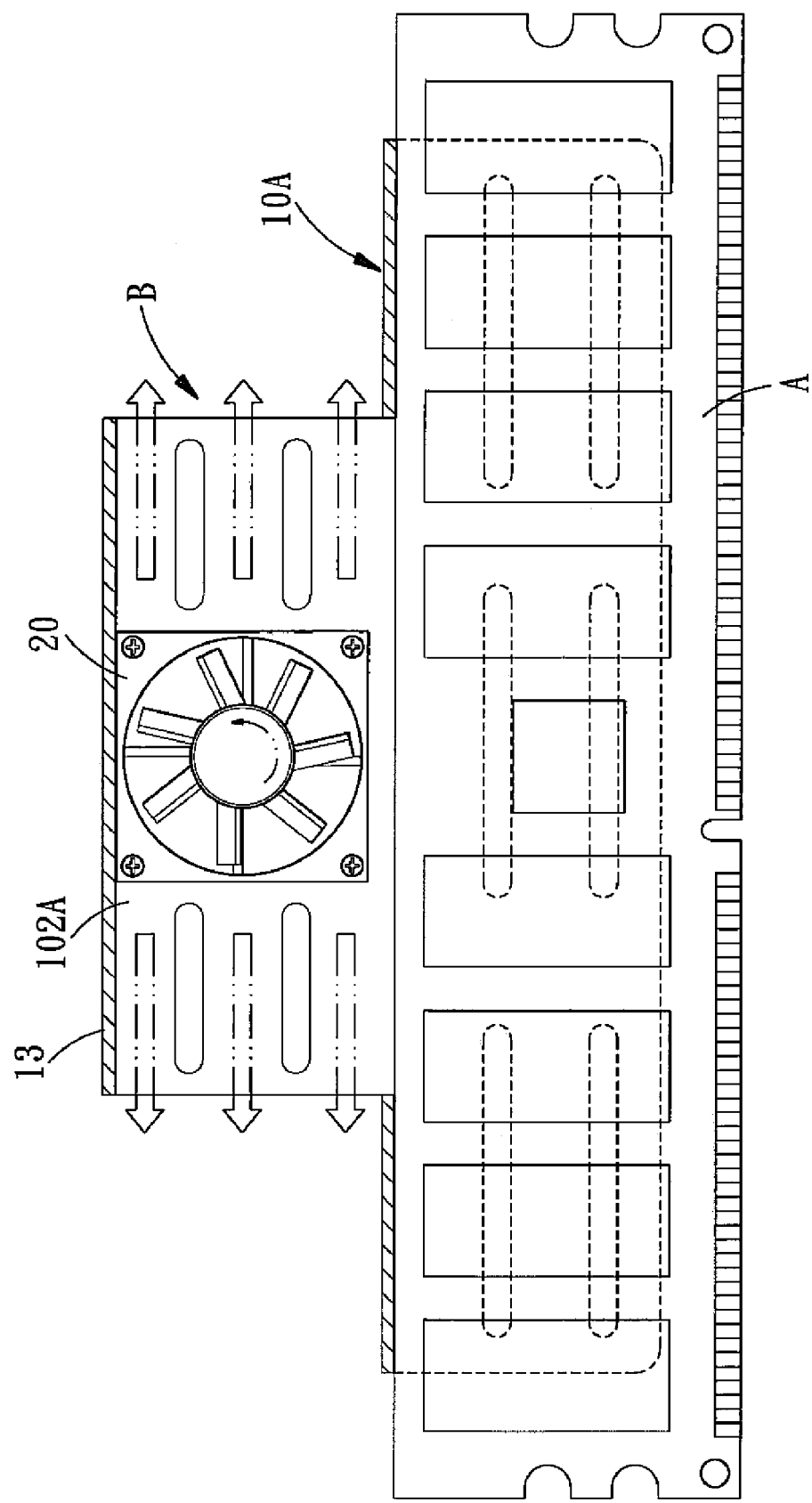
FIG. 5 is a sectional view of the heat sink for a memory in accordance with the present invention.

When the fan 20 is in use, the air can be sent into the convective space B, and the two heat-conducting sheets 10A, 10B can utilize their bases 101A, 10B to partially conduct the heat of the memory A to the heat-dissipating portions 102A, 102B, respectively, and then the air sent by the fan 20 performs the heat exchange with the memory A and the heat-dissipating portions 102A, 102B in the convective space B. As shown in FIG. 5, since the upper end of the convective space B is sealed by the cover plate 13, the air will carry the heat away through both ends of the convective space B for dissipating the heat of the memory A.

Moreover, the fan 20 is disposed at the center of the heat-dissipating portions 102A, 102B of the two heat-conducting sheets 10A, 10B, and the upper end of the convective space B is sealed by the cover plate 13, so after the air is guided in by the fan 20, it will be expelled through both ends of the convective space B. The air exhausted from each end only needs to discharge a half of the heat of the memory A, so the heat will be dissipated quickly. In addition, the fan 20, which is located at the center, sucks in the air and the air will be extracted through both ends, so the heat dissipation is uniform.

Figure 6:
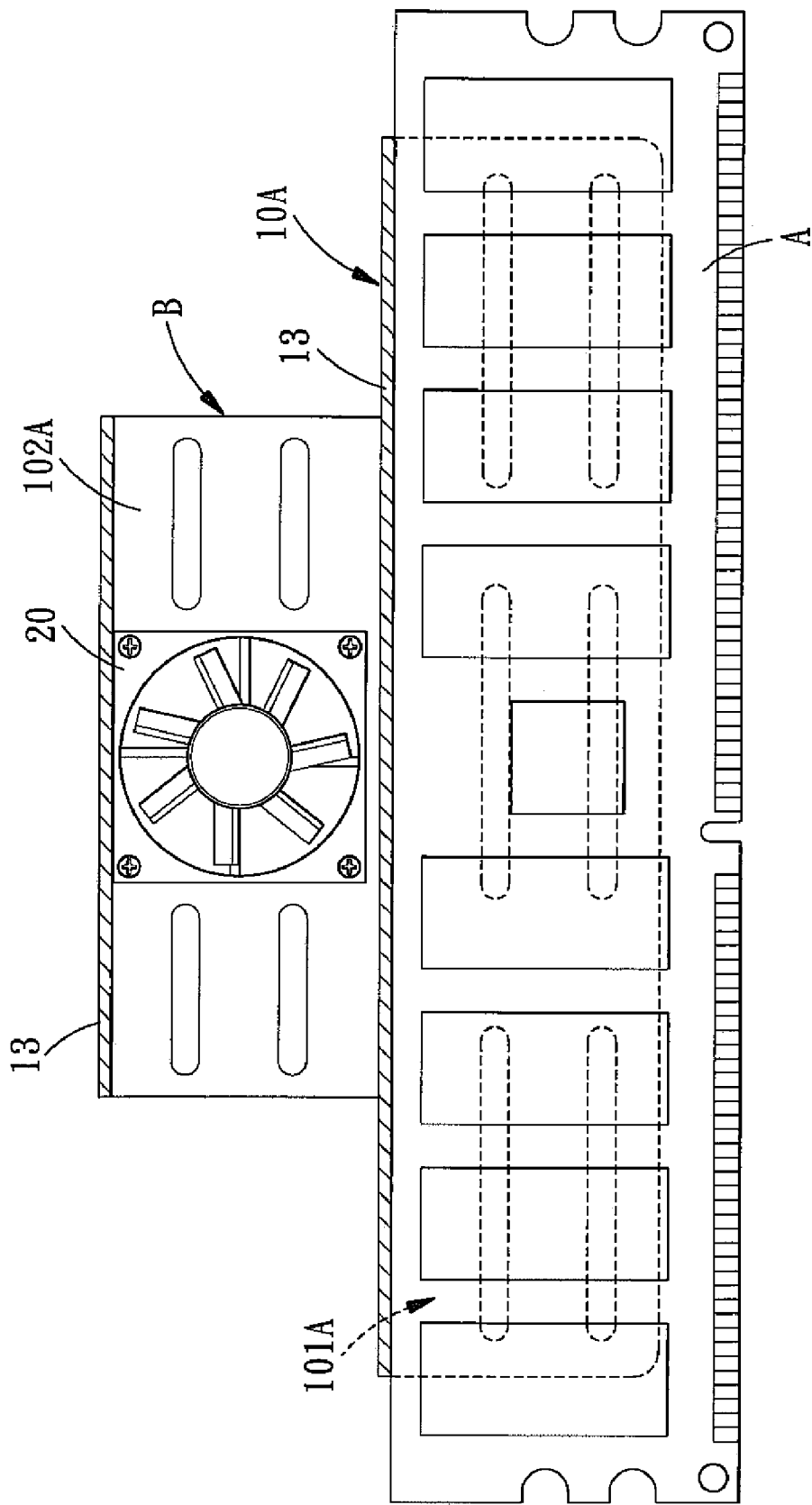
FIG. 6 shows that the base and the heat-dissipating portion are spaced by the cover plate in accordance with the present invention.

In addition, referring to FIG. 6, a cover plate 13 is extended toward the other heat-conducting sheet 10B from the upper end of the base 101A of the heat-conducting sheet 10A to separate the bases from the heat-dissipating portions of the two heat-conducting sheets and seal the lower end of the convective space B, thus preventing the air which has absorbed the heat from contacting the memory A. Thereby, the heat-dissipating effect of the memory A is not affected.

Figure 7:
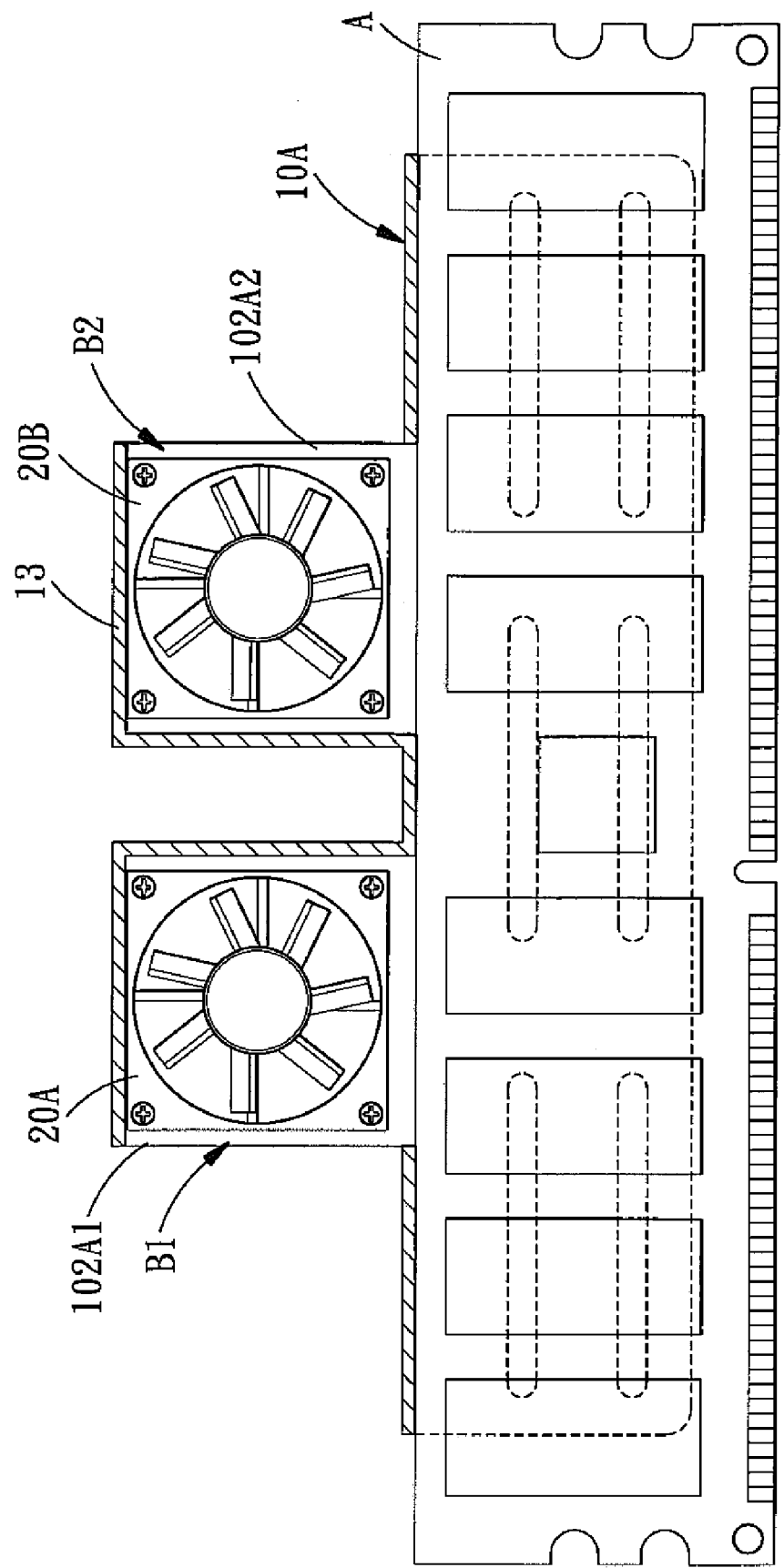
FIG. 7 shows that another heat sink for a memory comprises two transversely spaced convective spaces in accordance with the present invention.

Referring to FIG. 7 which shows another heat sink, the heat-conducting sheet 10A includes two transversely arranged heat-dissipating portions 102A1, 102A2. The other heat-conducting sheet (not shown) is also formed with two transversely arranged heat-dissipating portions correspondingly to the heat-dissipating sheet 10A. Two transversely spaced convective spaces B1, B2 are defined by the two heat-dissipating portions 102A1, 102A2 of the heat-conducting sheet 10A and the two heat dissipating portions of the other heat-conducting sheet. Two fans 20A, 20B are respectively disposed in the two convective spaces B1, B2. The heat-conducting sheet 10A is formed with a cover plate 13 extended from the upper end of one heat-dissipating portion 102A1 along the edge to the upper end of the heat-dissipating portion 102A2. The cover plate 13 of the heat-conducting sheet 10A is connected with the other heat-conducting sheet to seal the upper ends and the adjacent sides of the two convective spaces B1, B2. By such arrangements, the air can be respectively guided into the two convective spaces B1, B2 by the two fans 20A, 20B, and the air which has absorbed the heat will be expelled out through the two opposite ends of the two convective spaces B1, B2.

Figure 8:
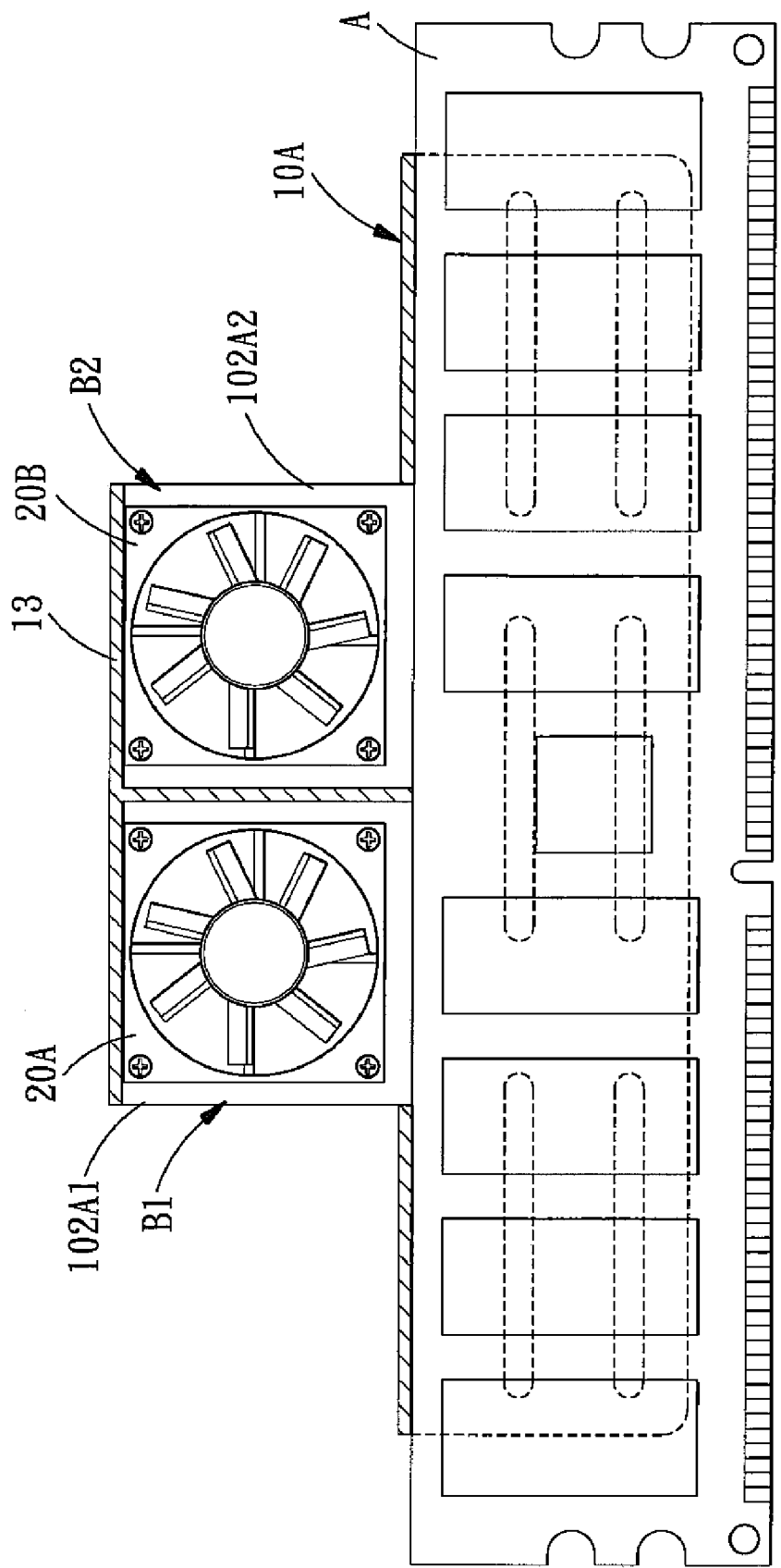
FIG. 8 shows that another heat sink for a memory comprises two transversely adjacent convective spaces in accordance with the present invention.

Referring to FIG. 8 which shows another heat sink, the heat-conducting sheet 10A includes two transverse adjacent heat-dissipating portions 102A1, 102A2 and a T-shaped cover plate 13. The cover plate 13 is extended from the upper end of the heat-dissipating portion 102A1 along the edge to the upper end of the other heat-dissipating portion 102A2, and the cover plate 13 is extended between the two heat-dissipating portions 102A1, 102A2. The other heat-conducting sheet (not shown) is formed with two transverse adjacent heat-dissipating portions (not shown) correspondingly to the heat-conducting sheet 10A. Two adjacent convective spaces B1, B2 are defined by the two heat-dissipating portions 102A1, 102A2 of the heat-conducting sheet 10A and the two heat-dissipating portions of the other heat-conducting sheet. The cover plate 13 is connected to the other heat-conducting sheet to seal the adjacent sides and the upper ends of the two convective spaces B1, B2. Two fans 20A, 20 are disposed in the two convective spaces B1, B2, respectively. By such arrangements, the air can be respectively guided into the two convective spaces B1, B2 by the two fans 20A, 20B, and then the air which has absorbed the heat will be extracted through the opposite ends of the two convective spaces B1, B2.

While we have shown and described various embodiments in accordance with the present invention, it is clear to those skilled in the art that further embodiments may be made without departing from the scope of the present invention.

What is claimed is:

1. A heat sink for a memory comprising two heat-conducting sheets and at least one fan; wherein:
    the two heat-conducting sheets are disposed at both sides of the memory, and each of the two heat-conducting sheets includes a base and at least one heat-dissipating portion, the two heat-conducting sheets utilizes the bases to clamp the memory, the memory is located under the two heat-dissipating portions of the two heat-conducting sheets, the heat-dissipating portions are used to define a convective space, a cover plate extended from an upper end of one of the heat-dissipating portions of one of the heat-conducting sheets serves to seal an upper end of the convective space, one of the heat-dissipating portions of one of the heat-conducting sheets is formed with a through hole; and
    the fan is disposed on one of the heat-conducting sheets to guide air into the convective space through the through hole, and then the air will be expelled out through the convective space.

2. The heat sink for a memory as claimed in claim 1, wherein the cover plate of the one of the heat-dissipating sheets is extended toward and connected with the other of the heat-dissipating sheets.

3. The heat sink for a memory as claimed in claim 1, wherein the fan is inserted through the through hole to be disposed in the convective space, and all sides of the fan are opened.

4. The heat sink for a memory as claimed in claim 1, wherein the heat-conducting sheet extended with the cover plate is extended with another cover plate on the base thereof to seal a lower end of the convective space.

5. The heat sink for a memory as claimed in claim 1, wherein each heat-conducting sheet is formed with two heat-dissipating portions, and two convective spaces are defined by the heat-dissipating portions of the two heat-conducting sheets, and each convective space is disposed with a fan.

6. The heat sink for a memory as claimed in claim 5, wherein the two convective spaces of the two heat-conducting sheets are transversely spaced, the cover plate of the one of the heat-conducting sheets is extended from the upper end and along an edge of the one of the heat-dissipating portions of the one of the heat-conducting sheets to an upper end of the other of the heat-dissipating portions of the one of the heat-conducting sheets, so as to seal two adjacent sides and two upper ends of the two convective spaces.

7. The heat sink for a memory as claimed in claim 5, wherein the two convective spaces of the two heat-conducting sheets are transversely adjacent, the cover plate of the one of the heat-conducting sheets is T-shaped and is extended from the upper end and along an edge of the one of the heat-dissipating portions of the one of the heat-conducting sheets to an upper end of the other of the heat-dissipating portions of the one of the heat-conducting sheets and extended between the two heat-dissipating portions of the one of the heat-conducting sheets heat-conducting sheet to seal two adjacent sides and the upper ends of the two convective spaces.

8. The heat sink for a memory as claimed in claim 1, wherein the base of each of the two heat-conducting sheets is formed with a plurality of transverse ribs.

9. The heat sink for a memory as claimed in claim 1, wherein the heat-dissipating portions of the two heat-conducting sheets are formed with a plurality of transverse ribs, respectively.

\* \* \* \* \*